United States Patent [19]

Alfaro et al.

[11] Patent Number: 4,974,767
[45] Date of Patent: Dec. 4, 1990

[54] DOUBLE CONE WIRE BONDING CAPILLARY

[75] Inventors: Rafael C. Alfaro, The Colony; James R. Peterson, Garland, both of Tex.

[73] Assignee: Texas Instruments Incorporated, Dallas, Tex.

[21] Appl. No.: 185,567

[22] Filed: Apr. 25, 1988

[51] Int. Cl.⁵ .......................................... H01L 21/603
[52] U.S. Cl. ..................................... 228/44.7; 228/4.5
[58] Field of Search ..................... 228/55, 54, 44.7, 4.5

[56] References Cited

U.S. PATENT DOCUMENTS

| | | | |
|---|---|---|---|
| 3,358,897 | 12/1967 | Christensen | 228/54 |
| 3,917,148 | 11/1975 | Runyon | 228/4.5 |
| 4,415,115 | 11/1983 | James | 228/4.5 |

FOREIGN PATENT DOCUMENTS

| | | | |
|---|---|---|---|
| 0096643 | 7/1980 | Japan | 228/54 |
| 191338 | 10/1984 | Japan | 228/4.5 |
| 2165178 | 4/1986 | United Kingdom | 228/44.7 |

Primary Examiner—Kenneth J. Ramsey
Attorney, Agent, or Firm—B. Peter Barndt; James T. Comfort; Melvin Sharp

[57] ABSTRACT

The disclosure relates to a wire bonding capillary having a body with a cylindrical upper portion and a contiguous lower tip portion, the tip portion having an exterior inward taper and an internal bore extending through the body, the bore having a first substantially constant cross sectional region extending through the cylindrical portion, a second inwardly tapering region contiguous to the first region, a third substantially constant cross sectional region contiguous to the second region, a fourth outwardly tapering region contiguous to the third region and a fifth outwardly tapered region contiguous to the fourth region having greater outward taper than the fourth region. The fourth region has a taper from about forty-five degrees to about ninety degrees and preferably seventy degrees and is substantially bisected by the axis of the bore and the taper in the fifth region is from about one hundred degrees to about one hundred seventy degrees and preferably one hundred ten degrees and is substantially bisected by the axis of the bore.

16 Claims, 1 Drawing Sheet

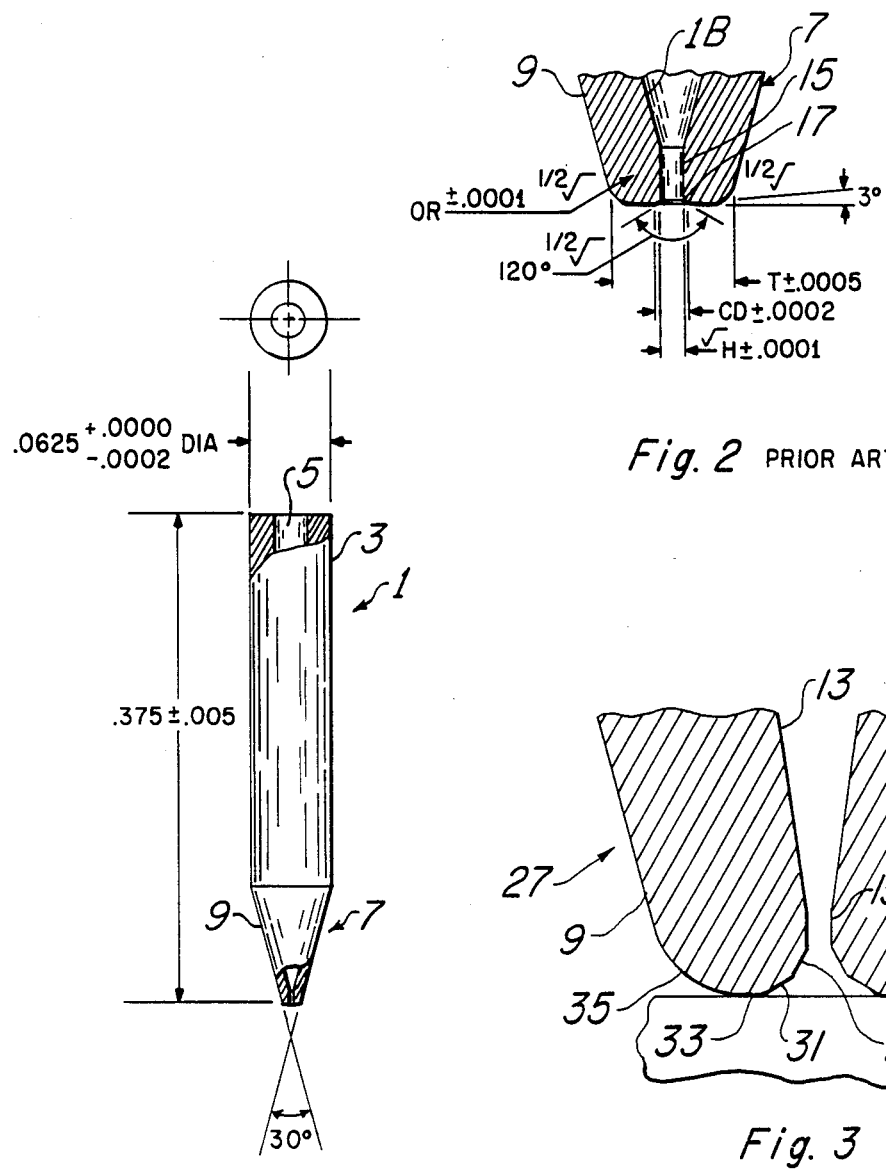

DOUBLE CONE WIRE BONDING CAPILLARY

BACKGROUND OF THE INVENTION

Field of the Invention

This invention relates to a capillary or ball bonding tool for use in bonding of wire to semiconductor devices.

Brief Description of the Prior Art

Capillaries or wire bonding tools for ball bonding of wire to electronic devices, particularly to bond pads of semiconductor devices, are, of necessity, a design compromise. Such capillaries are generally formed from a ceramic material, principally aluminum oxide, tungsten carbide, ruby and other materials as is well known. Very thin wire, generally on the order of about one mil gold, copper or aluminum wire, is threaded through an axial passage in the capillary with a small ball being formed at the end of the wire, the ball being disposed external of the capillary tip. The initial object is to bond the ball to a pad on the semiconductor device and then to bond a portion farther along the wire to a lead frame or the like. During the bonding cycle, the capillaries perform more than one function. For this reason, their design is not optimized for each function but, rather, is a compromise for performing each of the designated functions.

After the ball is formed, the capillary must first center the ball partly within the capillary for bond pad targeting. This centering occurs as the bond head starts to lower to the ball bond position. The chamfer or cone diameter of the capillary captures the ball and places centering forces thereon. Because of the pressure angle on the ball, smaller cone diameter angles provide better centering of the ball.

With a first bonding step, the ball is bonded to a pad on a semiconductor device, meanwhile minimizing ball spread and maximizing ball concentricity. When the bond head touches the ball down on the bond pad, the ball will be squashed and flatten out. Here again, the small angled cone diameter provides better centering. With the same cone diameter dimension, a small chamfer angle also helps to maintain the ball size small. This is because more of the ball material can be included in the cone of the capillary without squash out. When pressing on the ball during this first bonding step, depending upon the force applied on the ball, a large amount of ball flattening will probably weaken at the joint of the ball and the wire. It is desirable and known that the ball should not spread out but rather should stay partly within the capillary to form a volcano or conical shaped wire portion to provide a relatively large degree of strength in the transition from the ball to the wire. However, in the prior art, the bonded ball section had an ovoid or football shape due to the shape of the capillary.

The capillary then handles the wire during looping, smoothly feeding the bond wire both out of the capillary and then back into the capillary. The capillary then forms a "stitch" bond and a "tack" or "tail" bond which must not be cut. Because the inner chamfer is steep, the compression stress is high only for a small area inside the cone diameter. Also, the compression stress is a maximum at the cone diameter. This condition can cause the wire to be parted or cut at the cone diameter without an adequate tack bond having ever been formed. This, along with other factors, helps to create the all too frequent lost wire at the stitch. When the capillary rises to pigtail height, the friction of the wire in the capillary and any bonding that the wire has done to the capillary causes the wire to rise with the capillary, with no pigtail exposed. Even when the tack bond is sufficient to create a pigtail, the weak tack bond situation is not good. When the wire clamp clamps the wire at pigtail height, and the bond head rises to break the wire, it is desirable that the tack bond be strong enough to provide a straight pigtail. Straight pigtails result in balls that are well centered on the wire. The need for a strong tack bond is clear. A stronger tack bond can be created by capillaries with larger cone diameter angles since the area of high compression stress in the tack bond gets larger as the cone diameter angle becomes larger. However, as stated above, a large cone diameter angle is not desirable from the ball bond standpoint. Also, because of a need for dense interconnects with increasing circuit miniaturization, the capillary tip must be small, even though a broader tip would provide better bonds.

It is therefore apparent, as stated hereinabove, that the requirements for the two types of bonds required of the capillary require divergent cone diameter angles.

SUMMARY OF THE INVENTION

In accordance with the present invention, the above noted problems of the prior art are minimized and there is provided a capillary for bonding of wire to semiconductor devices which provides the desired result without the requirement of compromise as in the prior art.

Briefly, in accordance with the present invention, there is provided a double cone capillary for use in conjunction with wire bonding in the manner above described. The capillary has two internal cones, the first cone having a steep cone angle. This steep cone angle provides good ball centering and small bonded ball size. The second cone angle provides a good tack bond, making the capillary insensitive to losing the wire due to weak tack bonds and provides straight pigtails for good ball formation. The capillary is even more valuable when stitch bonding to low bondability material where more than standard pressures and ultrasonic energy have to be used to make the bond stick.

The first internal cone has a cone angle of from about 45 degrees to about 90 degrees and is bisected by the axis of the bore 15 with a preferred value of 70 degrees. The second internal cone has a cone angle of from about 100 degrees to about 170 degrees and is bisected by the axis of the bore 15 with a preferred value of 110 degrees.

BRIEF DESCRIPTION OF THE DRAWINGS

FIG. 1 is a perspective, partially cut away view of a prior art capillary;

FIG. 2 is an enlarged cross sectional view of the tip portion of the capillary of FIG. 1; and FIG. 3 is a cross sectional view of the tip portion of the capillary in accordance with the present invention.

DESCRIPTION OF THE PREFERRED EMBODIMENT

Referring first to FIGS. 1 and 2, there is shown a capillary 1 in accordance with the prior art. The capillary is formed of aluminum oxide and has an upper cylindrical portion 3 with an axial cylindrical bore 5 therein for carrying wire. The capillary includes a tip portion 7 at the lower end thereof which tapers externally at taper 9 to the slightly rounded tip 11. The taper 9 will be generally at an angle of about 30 degrees. The bore 5 is of generally uniform cross section for the full length of the cylindrical portion 3, the bore then having an inwardly tapered region 13 at the top portion of the tip portion 9 as best seen in FIG. 2. The bore then takes on a generally cylindrical shape of constant cross section 15 after which the bore takes on an outward taper 17 of from about 90 degrees to about 120 degrees. This outward taper 17, as discussed hereinabove, provides the compromise of the prior art.

In accordance with the present invention as shown in FIG. 3, wherein all references as in FIGS. 1 and 2 identify like elements, the upper cylindrical portion 3 is the same as in the prior art. The tip portion 27 at the lower end of the capillary has a taper 9 as in the prior art. In addition, the bore 5 extends into the tip portion in an inward taper 13 as in the prior art. The bore then proceeds with an outward tapered portion 29 which makes an angle of 70 degrees, this angle being capable of being from about 45 degrees to about 90 degrees. The bore then proceeds with a further outward tapered portion 31 which makes an angle of 110 degrees, this angle being capable of being from about 100 degrees to about 170 degrees. The bottom portion 33 of the tip portion 7 is relative flat and perpendicular to the axis of the bore, whereupon the tip portion curves at region 35 to the taper 9.

In accordance with the capillary design as described hereinabove, the problems of the prior art as stated hereinabove are minimized and there is provided a strong tack bond in conjunction with the conical or volcano shaped ball bond to the semiconductor pad.

Though the invention has been described with respect to a specific preferred embodiment thereof, many variations and modifications will immediately become apparent to those skilled in the art. It is therefore the intention that the appended claims be interpreted as broadly as possible in view of the prior art to include all such variations and modifications.

We claim:

1. A wire bonding capillary which comprises:
   (a) a capillary body having an upper portion and a contiguous lower tip portion; and
   (b) an internal bore extending entirely through said capillary body, said bore having:
     (i) a first substantially constant cross sectional surface region extending through said upper portion,
     (ii) a second inwardly tapering surface region disposed in said lower tip portion contiguous to said first region,
     (iii) a third substantially constant cross sectional surface region in said lower tip portion contiguous to said second region and on the side of said second region remote from said upper portion,
     (iv) a fourth outwardly tapering surface region in said lower tip portion contiguous to said third region and on the side of said third region, said taper in said fourth region being from about seventy degrees to about ninety degrees remote from said second region, and
     (v) a fifth outwardly tapered surface region in said lower tip portion contiguous to said fourth region, having greater outward taper than said fourth region and on the side of said fourth region remote from said third region.

2. A wire bonding capillary as set forth in claim 1 wherein said taper in said fifth region is from about one hundred degrees to about one hundred seventy degrees and is substantially bisected by the axis of said bore.

3. A wire bonding capillary as set forth in claim 2 wherein said capillary is formed from a material taken from the class consisting of aluminum oxide, tungsten carbide and ruby.

4. A wire bonding capillary as set forth in claim 3, further including a sixth surface region contiguous to said fifth region and normal to the axis of said bore.

5. A wire bonding capillary as set forth in claim 2, further including a sixth surface region contiguous to said fifth region and normal to the axis of said bore.

6. A wire bonding capillary as set forth in claim 1 wherein said capillary is formed from a material taken from the class consisting of aluminum oxide, tungsten carbide and ruby.

7. A wire bonding capillary as set forth in claim 3, further including a sixth surface region contiguous to said fifth region and normal to the axis of said bore.

8. A wire bonding capillary as set forth in claim 1, further including a sixth surface region contiguous to said fifth region and normal to the axis of said bore.

9. A wire bonding capillary which comprises:
   (a) a capillary body having an upper portion and a contiguous lower tip portion; and
   (b) an internal bore extending through said capillary body,
   (c) said bore having a first substantially constant cross sectional surface region extending through said upper portion,
   (d) a second inwardly tapering surface region contiguous to said first region in said lower tip portion and on the side of said first region remote from said upper portion,
   (e) a third substantially constant cross sectional surface region contiguous to said second region in said lower tip portion and on the side of said second region remote from said first portion,
   (f) a fourth outwardly tapering surface region contiguous to said third region in said lower tip portion and on the side of said third region remote from said second region, and
   (g) a fifth outwardly tapered surface region contiguous to said fourth region and having greater outward taper than said fourth region in said lower tip portion and on the side of said fourth region remote from said third region,
   (h) wherein said taper in said fourth region is about seventy degrees.

10. A wire bonding capillary which comprises:
    (a) a capillary body having an upper portion and a contiguous lower tip portion; and
    (b) an internal bore extending through said capillary body,
    (c) said bore having a first substantially constant cross sectional surface region extending through said upper portion,
    (d) a second inwardly tapering surface region contiguous to said first region in said lower tip portion and on the side of said first region remote from said upper portion,
    (e) a third substantially constant cross sectional surface region contiguous to said second region in said lower tip portion and on the side of said second region remote from said first portion, (f) a fourth outwardly tapering surface region contiguous to said third region in said lower tip portion and on the side of said third region remote from said second region, and (g) a fifth outwardly tapered surface region contiguous to said fourth region and having greater outward taper than said fourth region in said lower tip portion and on the side of said fourth region remote from said third region, (h) wherein said taper in said fifth region is about 110 degrees.

11. A wire bonding capillary which comprises:
(a) a capillary body having an upper portion and a contiguous lower tip portion; and
(b) an internal bore extending through said capillary body,
(c) said bore having a first substantially constant cross sectional surface region extending through said upper portion,
(d) a second inwardly tapering surface region contiguous to said first region in said lower tip portion and on the side of said first region remote from said upper portion,
(e) a third substantially constant cross sectional surface region contiguous to said second region in said lower tip portion and on the side of said second region remote from said first portion,
(f) a fourth outwardly tapering surface region contiguous to said third region in said lower tip portion and on the side of said third region remote from said second region, and (g) a fifth outwardly tapered surface region contiguous to said fourth region and having greater outward taper than said fourth region in said lower tip portion and on the side of said fourth region remote from said third region, (h) wherein said taper in said fifth region is about 110 degrees.

12. A wire bonding capillary as set forth in claim 9 wherein said capillary is formed from a material taken from the class consisting of aluminum oxide, tungsten carbide and ruby.

13. A wire bonding capillary as set forth in claim 10 wherein said capillary is formed from a material taken from the class consisting of aluminum oxide, tungsten carbide and ruby.

14. A wire bonding capillary as set forth in claim 11 wherein said capillary is formed from a material taken from the class consisting of aluminum oxide, tungsten carbide and ruby.

15. A wire bonding capillary as set forth in claim 6, further including a sixth surface region contiguous to said fifth region and normal to the axis of said bore.

16. A wire bonding capillary as set forth in claim 14, further including a sixth surface region contiguous to said fifth region and normal to the axis of said bore.

* * * * *